(12) United States Patent
Marwah et al.

(10) Patent No.: US 8,943,029 B2
(45) Date of Patent: *Jan. 27, 2015

(54) ON-LINE TRANSACTION PROCESSING (OLTP) COMPRESSION AND RE-COMPRESSION OF DATABASE DATA

(71) Applicant: Oracle International Corporation, Redwood Shores, CA (US)

(72) Inventors: Vineet Marwah, San Ramon, CA (US); Valentin G. Stredie, San Francisco, CA (US); Dheeraj Pandey, San Ramon, CA (US); Amit Ganesh, San Jose, CA (US)

(73) Assignee: Oracle International Corporation, Redwood Shores, CA (US)

( * ) Notice: Subject to any disclaimer, the term of this patent is extended or adjusted under 35 U.S.C. 154(b) by 49 days.

This patent is subject to a terminal disclaimer.

(21) Appl. No.: 13/763,663

(22) Filed: Feb. 9, 2013

(65) Prior Publication Data

US 2013/0159246 A1 Jun. 20, 2013

Related U.S. Application Data

(63) Continuation of application No. 11/875,642, filed on Oct. 19, 2007, now Pat. No. 8,392,382.

(51) Int. Cl.
*G06F 17/30* (2006.01)
*H03M 7/30* (2006.01)

(52) U.S. Cl.
CPC .... *G06F 17/30563* (2013.01); *G06F 17/30592* (2013.01); *G06F 17/30315* (2013.01); *G06F 17/30377* (2013.01); *H03M 7/30* (2013.01); *G06F 2212/401* (2013.01)
USPC .......................................... 707/693; 707/607

(58) Field of Classification Search
CPC ................... G06F 17/30592; G06F 17/30315; G06F 2212/401
USPC .................................................. 707/607, 693
See application file for complete search history.

(56) References Cited

U.S. PATENT DOCUMENTS

| 5,627,995 A | 5/1997 | Miller et al. |
|---|---|---|
| 6,360,300 B1 | 3/2002 | Corcoran et al. |

(Continued)

OTHER PUBLICATIONS

Chapter 2 of the publication "Oracle Database" Concepts, 10g Release 2 (10.2), publication B14220-02, Oct. 2005, pp. 18.

(Continued)

*Primary Examiner* — Apu Mofiz
*Assistant Examiner* — Jared Bibbee
(74) *Attorney, Agent, or Firm* — Omkar K. Suryadevara; Silicon Valley Patent Group LLP

(57) ABSTRACT

A computer is programmed to compress data of a database in response to database modification language (DML) statements generated by on-line transaction processing (OLTP) systems. In several embodiments, data that is initially added to a database block is left uncompressed until a predetermined condition is satisfied, which happens infrequently (relative to OLTP transactions on the block). When satisfied, the computer automatically compresses all uncompressed data in the block, which increases the amount of unused space in the block. New data is thereafter added uncompressed to the partially compressed block, until satisfaction of a predetermined condition whereby the partially compressed block is again compressed, i.e. re-compressed. Adding of new data to a partially compressed block and its compression are repeated unless another predetermined condition is met, in response to which the block is not further re-compressed, thereby to recognize a limit on the benefit from compression.

35 Claims, 12 Drawing Sheets

(56) References Cited

U.S. PATENT DOCUMENTS

| | | | |
|---|---|---|---|
| 7,058,783 | B2 | 6/2006 | Chandrasekaran et al. |
| 7,103,608 | B1 | 9/2006 | Ozbutun et al. |
| 7,733,249 | B2 | 6/2010 | Zhang |
| 2002/0073298 | A1 | 6/2002 | Geiger et al. |
| 2004/0003196 | A1 | 1/2004 | Wilson et al. |
| 2004/0054858 | A1 | 3/2004 | Chandrasekaran et al. |
| 2006/0212672 | A1 | 9/2006 | Chandrasekaran et al. |

OTHER PUBLICATIONS

Poess, M. et al. "Data Compression in Oracle", Proceedings of the 29th VLDB Conference, Berlin, Germany, 2003, pp. 11.

Ozbutun, C. "Table Compression in Oracle Database 10g Release 2", An Oracle White Paper, May 2005, pp. 8.

Graefe, G. et al. "Data Compression and Database Performance", Proc. ACM/IEEE-CS Symp. on Applied Computing, Kansas City, MO, Apr. 1991, pp. 10.

Westmann, T. et al. "The Implementation and Performance of Compressed Databases", Technical Report, Mar. 1998, Universitat Mannheim, 1998, pp. 13.

Ray, G. et al. "Database Compression: A Performance Enhancement Tool", International Conference on Management of Data (COMAD), Pune, India, Dec. 1995, pp. 20.

Cannane, A. et al. "A General-Purpose Compression Scheme for Databases", Proceedings of the 1998 Computer Science Postgraduate Students Conference, Royal Melbourne Institute of Technology, Melbourne, Australia, Dec. 8, 1998, pp. 8.

Ng, W-K. et al. "Block-Oriented Compression Techniques for Large Statistical Databases", IEEE Transactions for Knowledge and Data Engineering, vol. 9, Issue 2, Mar./Apr. 1997, pp. 29.

U.S. Appl. No. 11/875,642, filed Oct. 19, 2007 by Vineet Marwah et al., USPTO-PAIR (39 pages).

Non-Final Rejection dated Apr. 12, 2010 in U.S. Appl. No. 11/875,642, USPTO-PAIR, (8 pages).

Amendment dated Jul. 12, 2010 in U.S. Appl. No. 11/875,642, USPTO-PAIR, (15 pages).

Final Rejection dated Sep. 16, 2010 in U.S. Appl. No. 11/875,642, USPTO-PAIR, (11 pages).

Examiner Interview Summary dated Feb. 7, 2011 in U.S. Appl. No. 11/875,642, USPTO-PAIR, (3 pages).

Amendment filed with RCE dated Feb. 16, 2011 in U.S. Appl. No. 11/875,642, USPTO-PAIR, (11 pages).

Non-Final Rejection dated Mar. 27, 2012 in U.S. Appl. No. 11/875,642, USPTO-PAIR, (15 pages).

Applicant Initiated Interview Summary dated Jul. 6, 2012 in U.S. Appl. No. 11/875,642, USPTO-PAIR, (3 pages).

Amendment dated Jul. 27, 2012 in U.S. Appl. No. 11/875,642, USPTO-PAIR, (14 pages).

Notice of Allowance dated Oct. 24, 2012 in U.S. Appl. No. 11/875,642, USPTO-PAIR, (7 pages).

Amendment after Notice of Allowance dated Dec. 20, 2012 in U.S. Appl. No. 11/875,642, USPTO-PAIR, (9 pages).

Notice of Allowance dated Jan. 2, 2013 in U.S. Appl. No. 11/875,642, USPTO-PAIR, (4 pages).

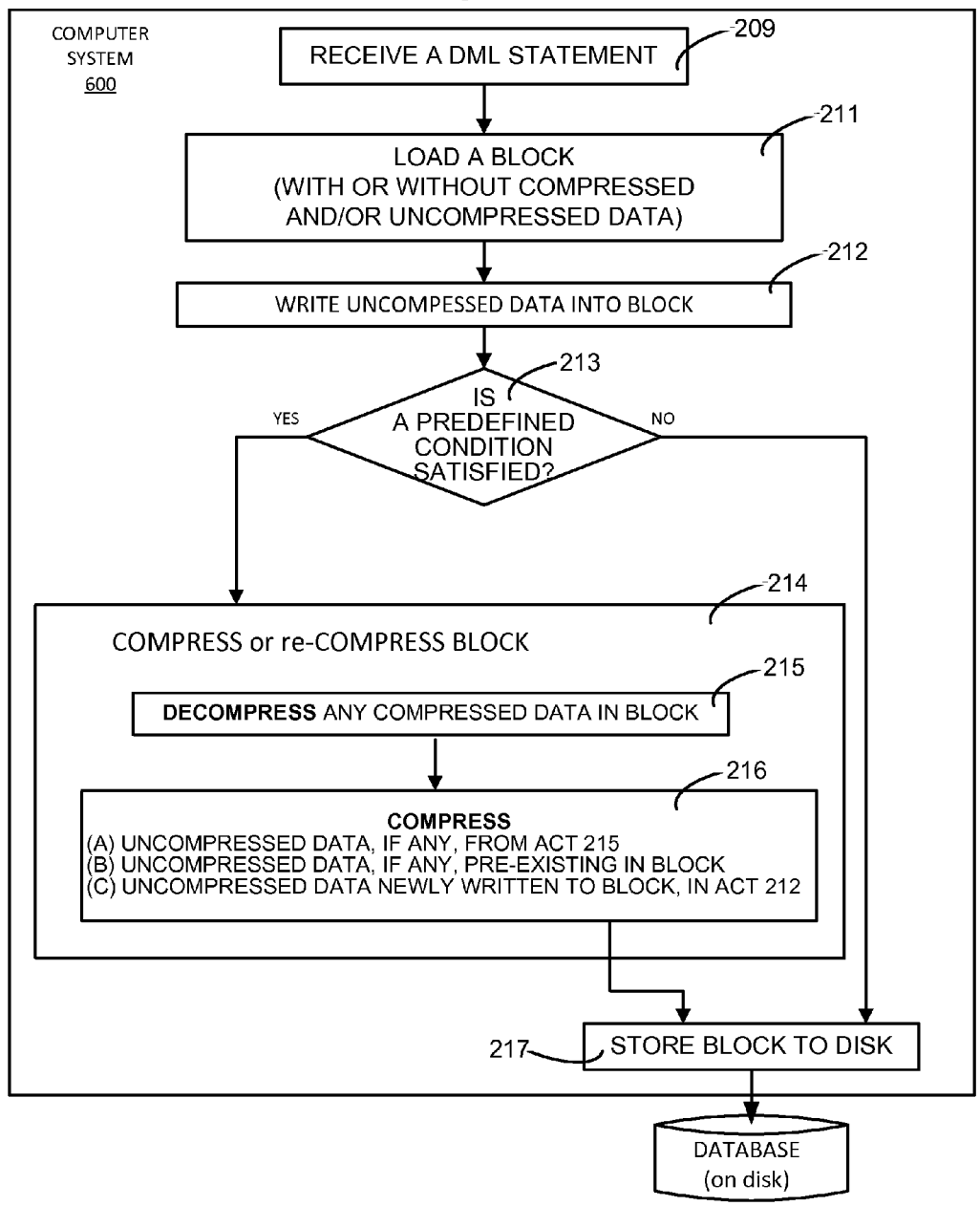

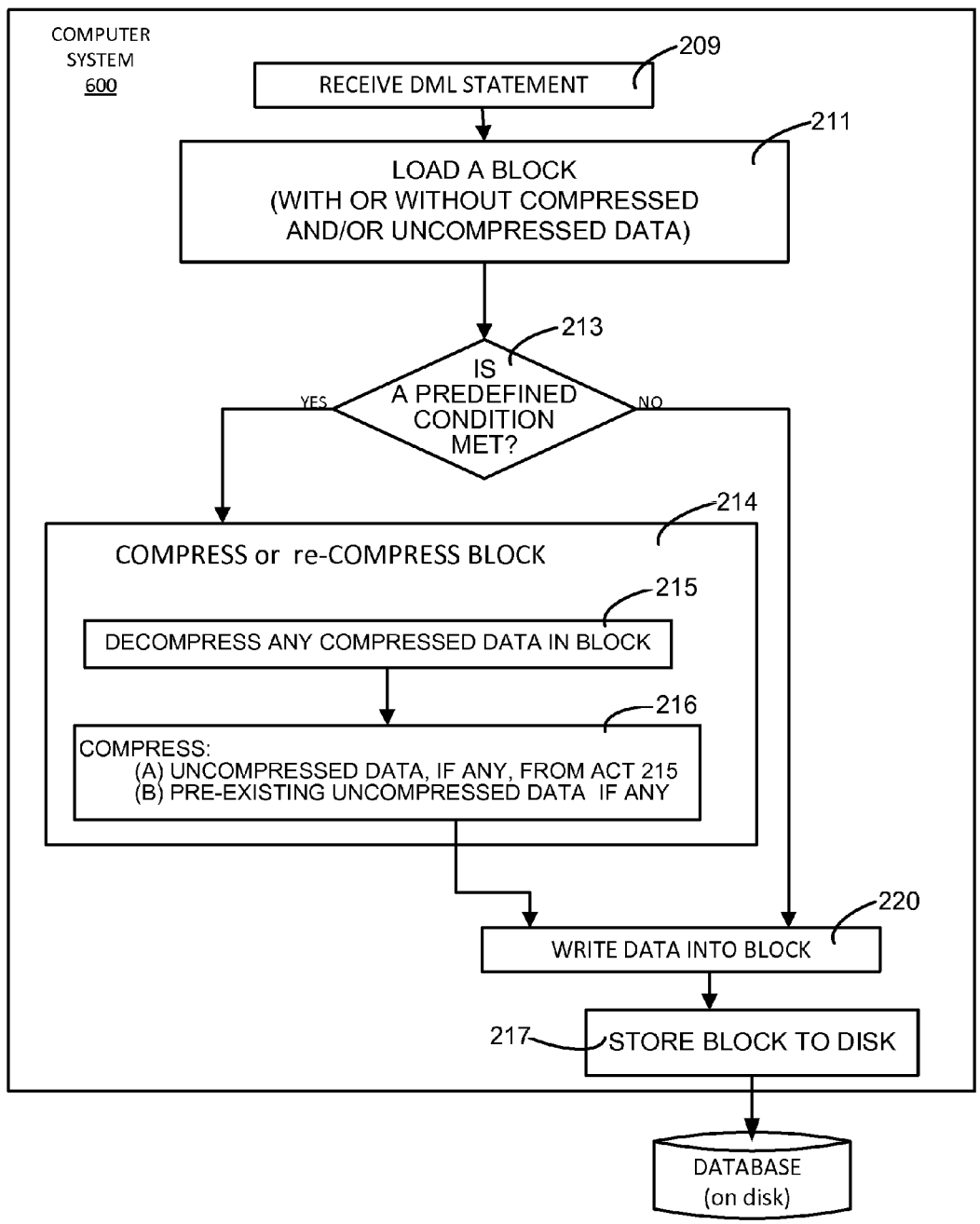

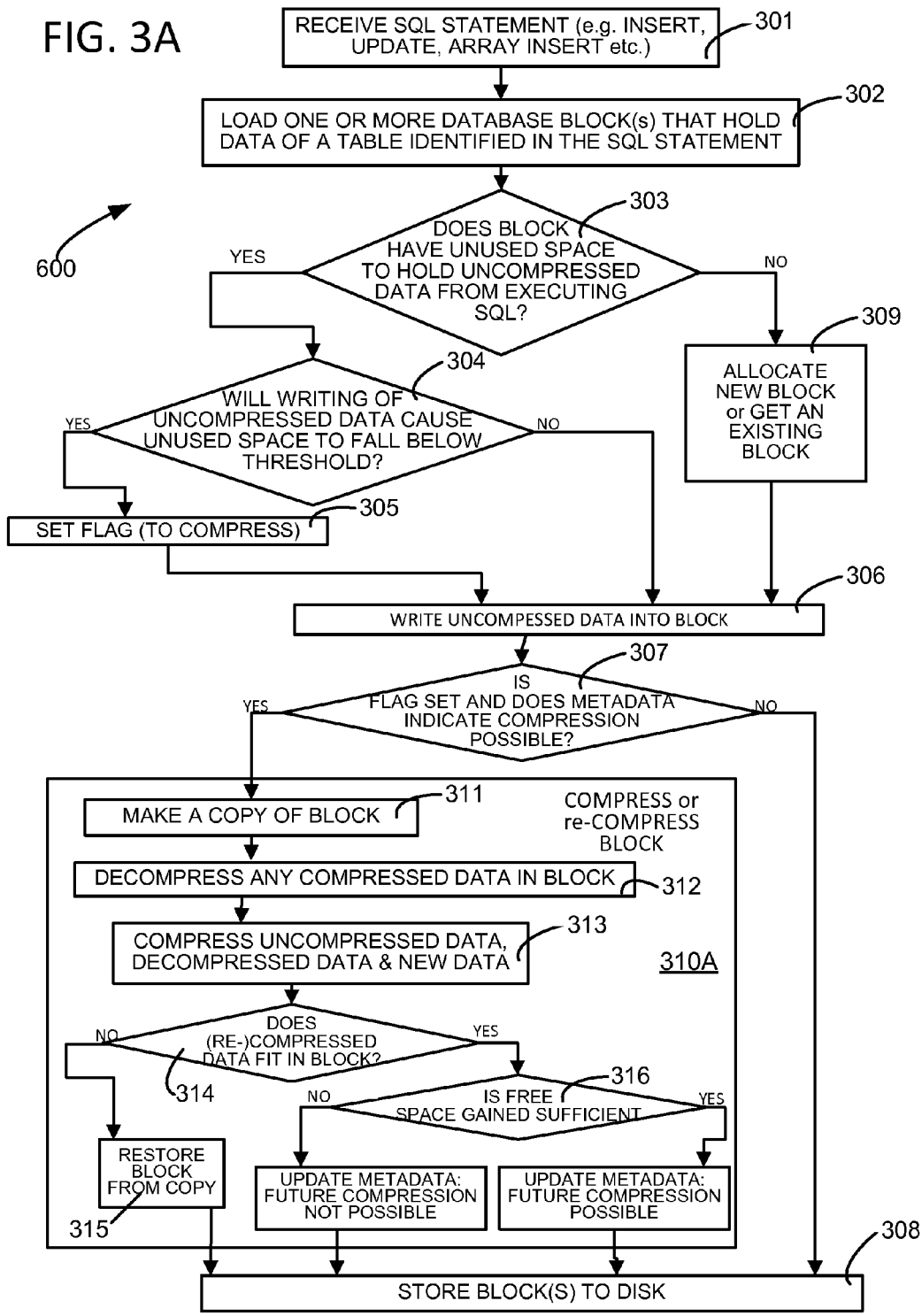

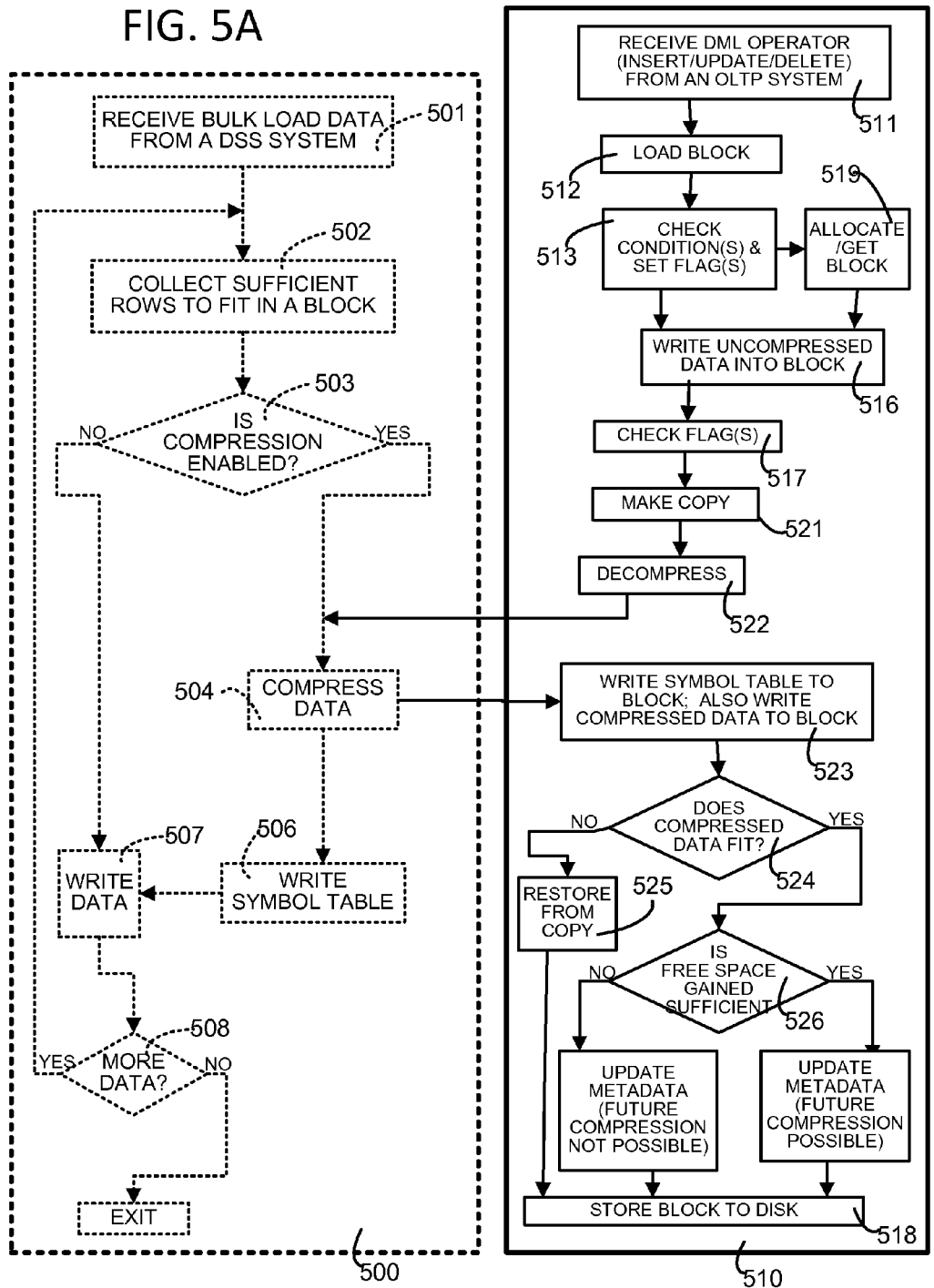

US 8,943,029 B2

ON-LINE TRANSACTION PROCESSING (OLTP) COMPRESSION AND RE-COMPRESSION OF DATABASE DATA

CROSS REFERENCE TO PARENT APPLICATION

This application is a continuation application of U.S. application Ser. No. 11/875,642 filed on Oct. 19, 2007, entitled "ON-LINE TRANSACTION PROCESSING (OLTP) COMPRESSION AND RE-COMPRESSION OF DATABASE DATA" by Vineet Marwah et al. that is incorporated by reference herein in its entirety.

Applicants hereby rescind any disclaimer of claim scope in the parent application (namely U.S. application Ser. No. 11/875,642) or the prosecution history thereof and advise the US Patent and Trademark Office (USPTO) that the claims in this continuation application may be broader than any claim in the parent application. Accordingly, Applicants hereby notify the USPTO of a need to re-visit all prior art cited in the parent application, including but not limited to prior art over which any disclaimer of claim scope was made in the parent application or the prosecution history thereof.

BACKGROUND

It is well known in the art for a computer 10 (FIG. 1A) to be programmed with a database management system (DBMS) 11 that provides support for OLTP systems. OLTP systems typically require real time processing of statements that are expressed in a structured query language (SQL), which has been standardized by American National Standards Institute (ANSI). SQL statements to access and change data may use one of the four keywords SELECT, UPDATE, DELETE, and INSERT, which together form a Data Manipulation Language (DML) part of SQL.

On receipt of such statements, it is necessary for computer 10 to execute the requested transaction on the database very quickly, and respond back to the OLTP system with appropriate results. Examples of OLTP transactions include processing of real time sales, e.g. at a cash register in a grocery store, a database of inventory is updated in real time, as items are scanned by the clerk. A prior art DBMS 11 is typically implemented in computer 10 to include a parser, an optimizer, a query plan generator and an execution engine (not labeled; see FIG. 1A). The execution engine operates on data brought from a disk 18 to a region in main memory 17, which region is known as a buffer cache, or simply cache.

During normal operation of DBMS 11, data is retrieved from disk 18 in fixed size pieces, called "blocks", "pages", "data blocks", "logical blocks" etc, an example of which is block 13 (FIG. 1A). A block is the smallest unit of data that is stored into or retrieved from a database on disk 18. The block typically includes a header region 14, data in region 16, and an empty region 15 in to which additional data can be written. Contiguous blocks that are allocated for storing a specific type of information constitute another level of data granularity, and are together called an "extent." A set of extents which are stored in the same table space constitute a segment in a table. For more information on storage structures used to access data in databases, see Chapter 2 of the publication "Oracle Database" Concepts, 10gRelease 2 (10.2)", publication B14220-02, published in October 2005.

Referring to FIG. 1A, block 13 is an in-memory copy of a block B1 from disk 18 (which disk holds the database managed by DBMS 11). Initially, for a given table in the database, DBMS 11 starts with an empty block B1 at time t1, and as a number of OLTP transactions take place, block B1 to eventually fills up, as illustrated in the time sequence t1-t5. When a new row can no longer be written to block B1, DBMS 11 allocates a new block B2, which is then again progressively filled as shown by the time sequence t6-t9. When block B1 cannot hold a new row, DBMS 11 again allocates a new block B3 (at time t10). Note that all data in blocks B1-B3 is uncompressed, i.e. prior art DBMS 11 does not support compression of blocks, B1-B3. Instead, data that is received from an OLTP application is stored directly, i.e. uncompressed in database 18.

One reason for storing database data uncompressed is that transactions for an OLTP application must be executed in real time, whereas compression can delay the response. However, compression for certain data warehouse transactions that are executed as batch jobs, such as bulk loads into the database, is supported in certain prior art DBMS systems, such as ORACLE 10gR2 sold by ORACLE CORPORATION, Redwood Shores, Calif. Specifically, stored data on disk can be compressed by reducing or eliminating duplicate values in a block of data. For example, as illustrated in FIG. 1B, duplicate values ("Meyer", "11 Homestead Rd", "1.99", "McGryen" and "3 Main Street") are replaced with references to a symbol table which holds a single copy of each duplicate value. The smallest granularity of values in a symbol table is at the level of a column. However, a value in a symbol table can occur as a sequence of column values, and this is called multi-column compression.

One prior art method used to support bulk load operations in a relational database management system (RDBMS) is described in a paper by Miekel and Poess and Dmitry Potapov entitled "Data Compression in Oracle" published in the Proceedings of the $29^{th}$ VLDB Conference, Berlin, Germany, 2003, which paper is incorporated by reference herein in its entirety as background.

One reason compression works well in bulk load operations is that all of the data to be written to a database block is immediately available within the prior art DBMS, for use in computing an appropriate symbol table that is applicable to the entire block. For the same reason, compression is normally not available for data management language (DML) statements of the type generated during on-line transaction processing (OLTP). Specifically, due to their nature, OLTP transactions within the computer may access different tables, and even if the same table is accessed they may access different blocks. Accordingly, only a small fraction of the data of a block may be supplied by each OLTP transaction, which makes compression of such data (and therefore compression of the block) difficult.

SUMMARY

A database management system in a computer is programmed in accordance with the invention to compress the data of a database table used by data modification language (DML) statements of the type generated by on-line transaction processing (OLTP) systems. In several embodiments, a number of rows that are initially added to an empty block of the table are left uncompressed until at least a predetermined condition is satisfied, which happens infrequently (relative to the frequency of OLTP transactions on the block). When at least the predetermined condition is satisfied, the computer of some embodiments automatically compresses all rows in the block, which increases the amount of unused space in the block. In several embodiments, new rows are thereafter added into unused space in the block, in response to OLTP transactions. The new rows are added uncompressed to the block, and hence at this stage the block holds compressed and uncompressed rows ("partially compressed block").

Unused space in a partially compressed block is used to hold new rows until a predetermined condition is again satisfied, whereby the partially compressed block is again compressed (which process is also called "re-compression"). Addition of uncompressed rows to a partially compressed block and that block's occasionally re-compression (as described in the preceding sentence) are repeatedly performed unless another condition ("limiting condition") is met, in response to which the block is no longer re-compressed (until rows are deleted from the block, to generate additional unused space).

Compressing and re-compressing a block, every once in a while based on predetermined condition(s) as described above (i.e. not each time when a new row is inserted) enables a database management system of several embodiments to service OLTP transactions in real time, with no degradation in performance on almost all transactions, except for the few infrequent occasions when the predetermined conditions are satisfied. Also, in some embodiments, a database block's compression or re-compression is performed in a separate transaction which is different from execution of the database transaction itself, to ensure that unused space generated from compression is available to other transactions, and remains available even if the database transaction is rolled back.

BRIEF DESCRIPTION OF THE DRAWINGS

FIGS. 2B, 2C and 2D illustrate, in three alternative high-level flow charts, acts performed by a computer system for OLTP data compression in three alternative embodiments of the invention.

FIGS. 3A and 3B illustrate, in two low-level flow charts, acts performed in two alternative methods of data compression in illustrative implementations of the invention.

FIGS. 5A and 5B illustrate, in intermediate level flow charts, acts performed in two alternative embodiments of a method used by the database management system of FIG. 4.

DETAILED DESCRIPTION

A database management system of several embodiments of the invention benefits from data compression, but without incurring a large penalty in responsiveness (incurred if a block of data is decompressed and compressed during every transaction), by only compressing and re-compressing a block, every once in a while, e.g. based on one or more predetermined condition(s).

Figure 1A:
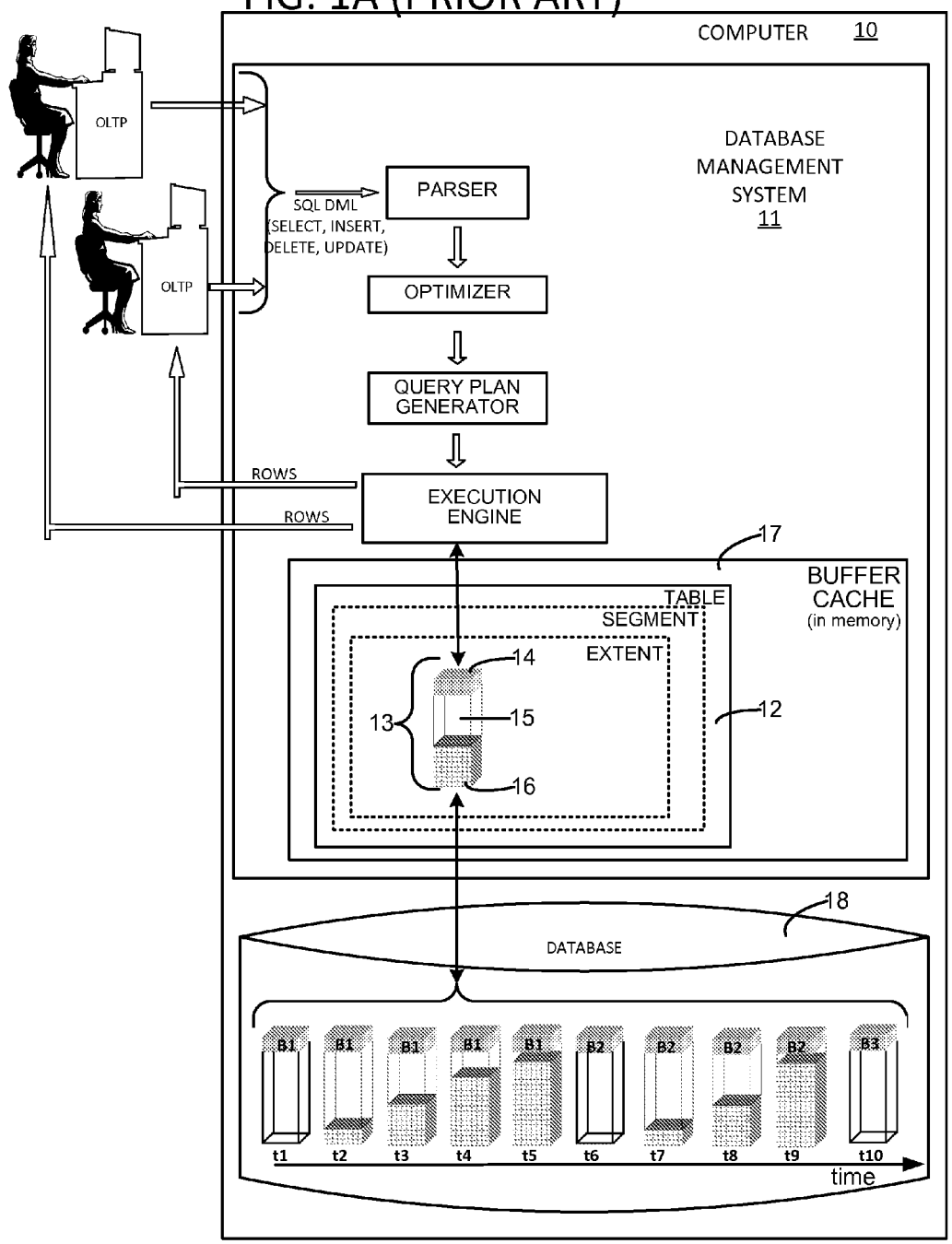
FIG. 1A illustrates, in a high level block diagram, various components of a prior art database management system that supports OLTP systems.
Figure 1B:
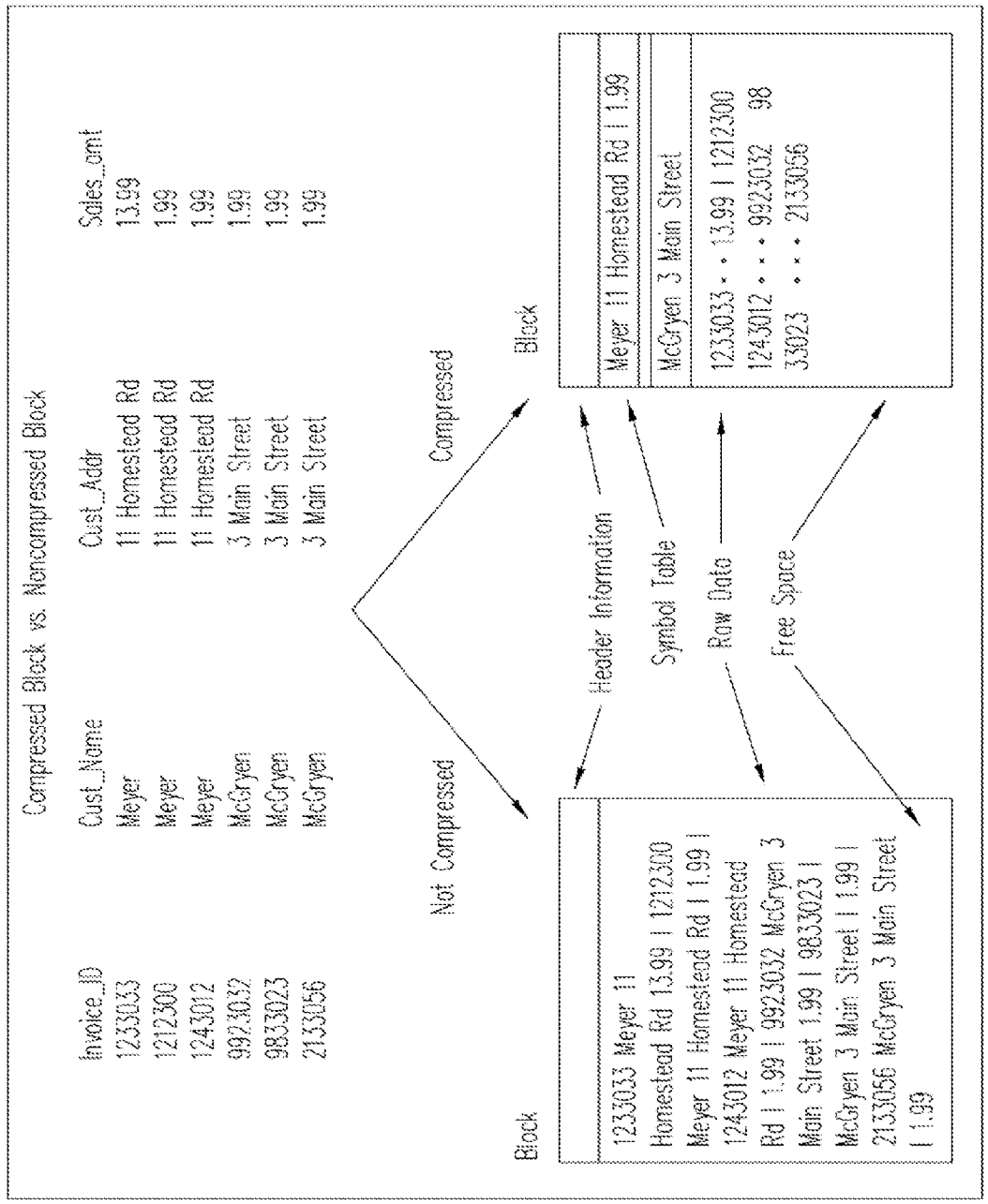
FIG. 1B illustrates a symbol-table based compression technique of the prior art.
Figure 2A:
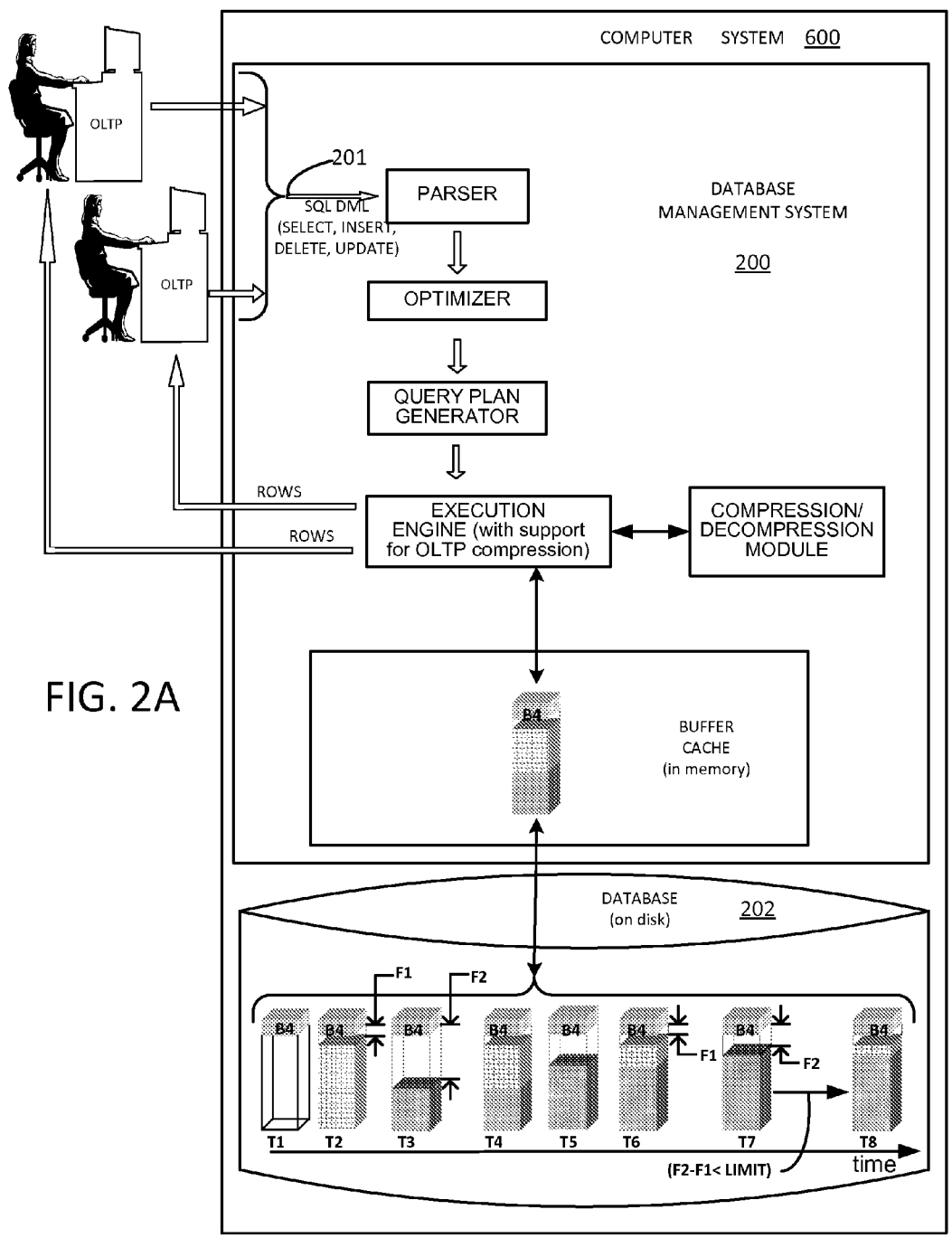
FIG. 2A illustrates, in a high level block diagram, components of a database management system in accordance with the invention that supports compression of data while executing SQL DML statements of the type normally issued by OLTP systems.

Accordingly, in many embodiments, a computer system 600 (FIG. 2A) is programmed in accordance with the invention to compress the data of a database 202 lazily, in response to data management language (DML) statements 201 that are normally received (as per act 209 in FIG. 2B) from on-line transaction processing (OLTP) systems. Initially, a database block B4 (FIG. 2A) that is loaded into memory (as per act 211 in FIG. 2B) is empty as shown at time T1 (FIG. 2A). In response to several OLTP transactions that reference a table to which block B4 belongs, data is written to block B4 (as per act 212 in FIG. 2B), and B4 is left uncompressed as shown during the time period T1-T2 (see bottom of FIG. 2A). The newly added data in block B4 remains uncompressed over time, as more new data is added to block B4, until a predetermined condition is satisfied (as per act 213 in FIG. 2B).

The predetermined condition which is used depends on the embodiment, and can be different in different embodiments. In an illustrative embodiment, the predetermined condition is on the amount of unused space F1 within block B4 (FIG. 2A). In a first example, the predetermined condition checks if F1 falls below a preset minimum (e.g. 2K). In a second example, the predetermined condition checks if F1 falls below a predetermined fraction (e.g. $1/10^{th}$) of size of block B4. In a third example, the predetermined condition is independent of unused space, and instead it simply checks if a number of rows U that are uncompressed in block B4 (FIG. 2A) is greater than a preset maximum. In a fourth example, the predetermined condition is independent of block B4 altogether, and instead it simply checks if new data to be inserted is of a size that is greater than a upper limit. In a fifth example, the predetermined condition checks if a commit statement has been received. In a sixth example, the predetermined condition checks if F1 becomes less than an integral multiple of the average size of a row in block B4. In the sixth example, if the integral multiple is chosen to be 1, then the condition checks for F1 less than the average size of a row, i.e. a new row is unlikely to be accommodated in block B4. In the sixth example, the likelihood of accommodating a new row is increased if the integral multiple is greater than 1, e.g. 2 or 3, and a specific integral multiple that is used depends on the embodiment. As will be apparent to the skilled artisan, any two or more of the just-described conditions may be combined to form a predetermined condition of some embodiments. Accordingly, the predetermined condition can take many different forms, depending on the embodiment.

The predetermined condition is appropriately selected, ahead of time, to ensure that for most OLTP transactions the predetermined condition is not satisfied. Accordingly, the "NO" branch is taken from act 213 (FIG. 2B), wherein the block B4 is written to disk (or any other storage device that is non-volatile, e.g. flash memory), followed by returning to act 211 (described above). Occasionally, which happens infrequently, the predetermined condition is met in act 213 (FIG. 2B), and the "YES" branch is taken to an operation 214 which compresses all the data in block B4 (FIG. 2A). The first time that the "YES" branch is taken, all data within block B4 is uncompressed (see time T2 in FIG. 2A). Accordingly, operation 214 compresses all the data in block B4, followed by storing the block (as per act 217) to disk (or other such storage device that is non-volatile, e.g. flash memory). Hence, the block compression in operation 214 increases the unused space in block B4 to F2 as illustrated in FIG. 2A at time T3. The just-described sequence of steps from time T1 to T3, which begin with the block B4 being empty, is also called hereinafter as "initial compression".

After time T3, in the next several OLTP transactions for the same table, the above-described acts 211, 212, 213, the "NO" branch from 213 (FIG. 2B) and 217 are repeatedly performed. Hence, unused space in block B4 is used as illustrated at time T4 (FIG. 2A) to hold additional data uncompressed, which additional data is received after the above-described compression. At this stage, block B4 holds a combination of compressed data and uncompressed data as illustrated at time T4 (FIG. 2A). Such a block, which holds both kinds of data (compressed and uncompressed) is also referred to as a "partially compressed" block. In some embodiments, block B4 contains metadata which identifies the compression state of the data, e.g. each row has a flag which indicates whether or not that row is compressed.

Addition of uncompressed data to the partially compressed block continues between times T4 and T5 (FIG. 2A) until satisfaction of the predetermined condition in act 213 (FIG. 2B) which happens at time T5. Depending on the embodiment, the predetermined condition ("re-compression condition") used to perform act 213 at time T5 may be same as or different from an initial condition which is used to perform act 213 for the first time at time T3. At time T5, the partially compressed block B4 is again compressed ("re-compression") as per operation 214 (FIG. 2B). Since block B4 is already partially compressed, at this stage act 215 is performed to decompress any compressed data in block B4, followed by a compression in act 216.

Specifically, in act 216 (FIG. 2B), computer system 600 compresses three uncompressed data from three sources: (A) uncompressed data, if any, output by act 215, (B) pre-existing uncompressed data if any, e.g. stored in block B4 between times T3 and T5, and (C) new uncompressed data resulting from a most-recent OLTP transaction that has triggered the current iteration of acts 211-213, i.e. immediately before the re-compression condition was satisfied. After compression in act 216, the block B4 is stored to disk as per act 217, as illustrated by the block B4 shown in FIG. 2A for the time T5. The just-described process is again repeated, with the uncompressed data being added to block B4 at time T6, followed by compression as illustrated at time T7, followed by adding uncompressed data again to block B4 as illustrated at time T8.

Repetition of the just-described process is stopped when another condition ("limiting" condition) is satisfied. Specifically when the limiting condition on the repetition is satisfied, the block B4 is not re-compressed any more, i.e. the computer system 600 is programmed to recognize a limit on the benefit from re-compression. In some embodiments, the limiting condition is based on the amount of unused space generated by re-compression, specifically F2-F1, wherein F2 is the unused space after re-compression and F1 is the unused space prior to re-compression. In certain illustrative embodiments, the limiting condition checks if F2-F1 falls below a predetermined percentage of the size of block B4, e.g. 10%, or 20% or 30% depending on the embodiment.

Although a specific sequence of acts is illustrated in FIG. 2B for some embodiments, the sequence can be different in other embodiments. For example, in certain embodiments, the predefined condition is checked in act 213 (FIG. 2C) immediately after loading of a block from disk into memory of computer system 600. If the condition is met, then compression operation 214 (FIG. 2C) is performed. In this example, writing of data into the block is not performed until after compression operation 214 (FIG. 2C). If the predefined condition is not met, then the "no" branch is taken from act 213 and uncompressed data is written directly into the block as per act 220 (FIG. 2C). In the embodiment shown in FIG. 2C, the block is stored to disk as per act 217 which follows the writing in act 220. Note that the compression act 216C in FIG. 2C differs from the corresponding compression act 216B in FIG. 2B in the specific data that is being compressed. Specifically, act 216B of FIG. 2B compresses data from three sources (A)-(C) as noted above, while act 216C of FIG. 2C compresses data from two sources (A) and (B).

Figure 2D:
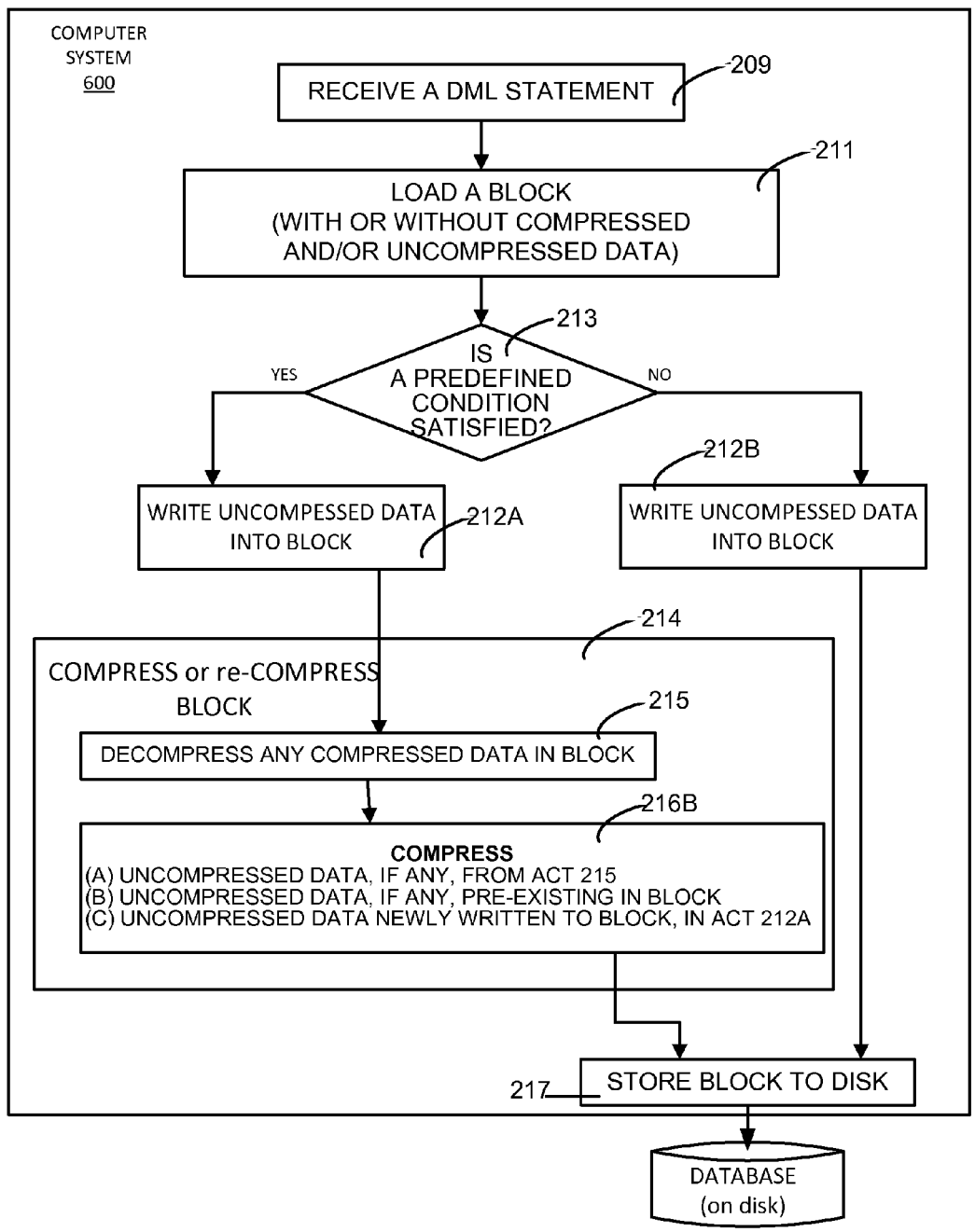

FIG. 2D illustrates yet another embodiment, wherein uncompressed data is written into the block as per acts 212A and 212B after act 213. Specifically in this embodiment, compression operation 214 (FIG. 2D) is performed after the writing in act 212A, and hence this embodiment of FIG. 2D uses the compression act 216B that was used in FIG. 2B, and accordingly compresses data from three sources (A)-(C) as noted above. Depending on the specific predefined condition that is used in act 213, the embodiment of FIG. 2D could change one or more underlying assumptions used in evaluating the predefined condition when act 212A is performed prior to operation 214.

Certain embodiments of computer system 600 implement the invention by performing the acts illustrated in FIG. 3A. Specifically, computer system 600 receives a SQL statement from an OLTP system in an act 301. The SQL statement includes DML operators, such as INSERT, UPDATE, DELETE and ARRAY INSERT. Next, in act 302, the computer system 600 loads into memory, one or more database blocks that hold data of a table identified in the SQL statement. Next, in act 303, the computer system 600 checks if a current block for the given table has any unused space to hold uncompressed data that is generated by executing the SQL statement received in act 301.

If the answer is yes in act 303, the computer system 600 checks (as per act 304) if the writing of uncompressed data into the block B4 will cause the unused space in block B4 to fall below a threshold. If so, the computer simply sets a flag (as per act 305) and then goes to act 306 to write the uncompressed data into the block. If the answer is no in act 304, the computer directly goes to act 306 without setting any flags. If the answer is no in act 303, computer system 600 allocates a new database block or gets an existing block as per act 309, and thereafter uses that block to write uncompressed data therein.

After act 306, computer system 600 goes to act 307 to see if the flag is set (which was to have been set in act 306). If flat is not set, then a compression or re-compression is not required and hence computer system 600 proceeds to act 308 which is implemented same as act 217 (described above in reference to FIGS. 2B-2D). Thereafter, computer system 600 returns to act 302 (described above). If the flag is set, then compression operation 310A is performed as follows. The computer system 600 makes a copy of the block B4 which is to be compressed, in an act 311. Next, in act 312, any compressed data in block B4 is retrieved and decompressed, followed by compression in act 313. As noted above, the act 313 compresses not only uncompressed data, but also decompressed data and new data. Next, in act 314, the computer system 600 checks if free space in block B4 is sufficient, and if so goes to act 316 to update metadata for block B4, e.g. by computing a symbol table and/or calculating a check sum. In act 314, if the free space in block B4 is not sufficient (i.e. unused space is less than the threshold), then computer system 600 proceeds to act 315. In act 315, the computer system 600 restores the block, based on a copy that was saved in act 311. After act 315, the computer system 600 proceeds to act 308 (discussed above).

Figure 3B:
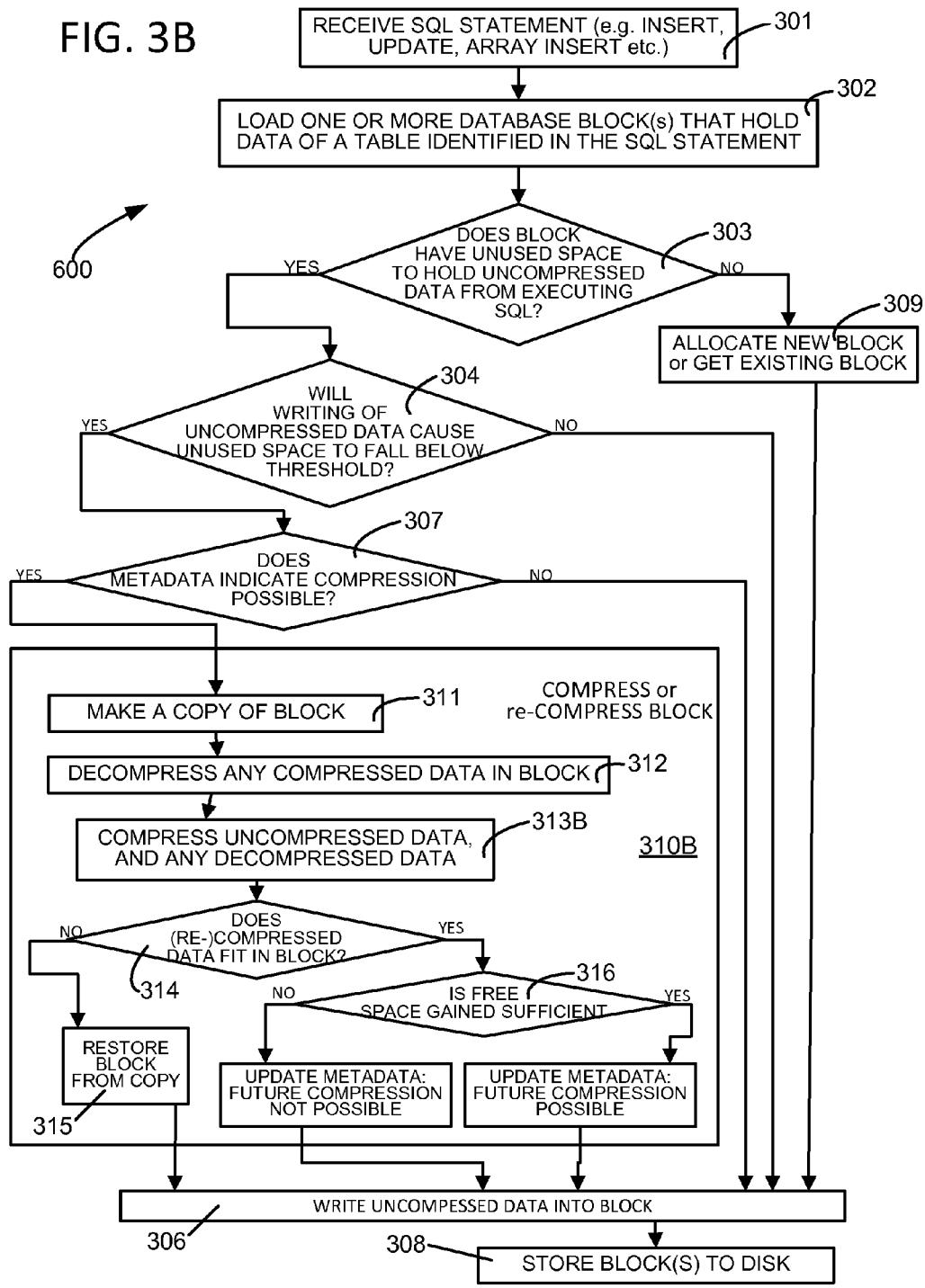

Although a specific sequence of acts is illustrated in FIG. 3A for some embodiments, the sequence can be different in other embodiments. For example, in certain embodiments, acts 305 and 307 related to the flag are not performed as illustrated in FIG. 3B. Specifically, after act 304 in FIG. 3B, a compression operation 310B is performed. Operation 310B is similar to operation 310A described above in reference to FIG. 3A, except for the order in which these two operations are performed relative to act 306 for writing uncompressed data into the block. Specifically, act 306 of FIG. 3A is performed prior to operation 310A whereas act 306 of FIG. 3B is performed subsequent to corresponding operation 310B. Accordingly, as will be apparent to the skilled artisan, in view of this disclosure, FIGS. 3A and 3B illustrate details for implementing the corresponding embodiments shown in FIGS. 2B and 2C.

Figure 4:
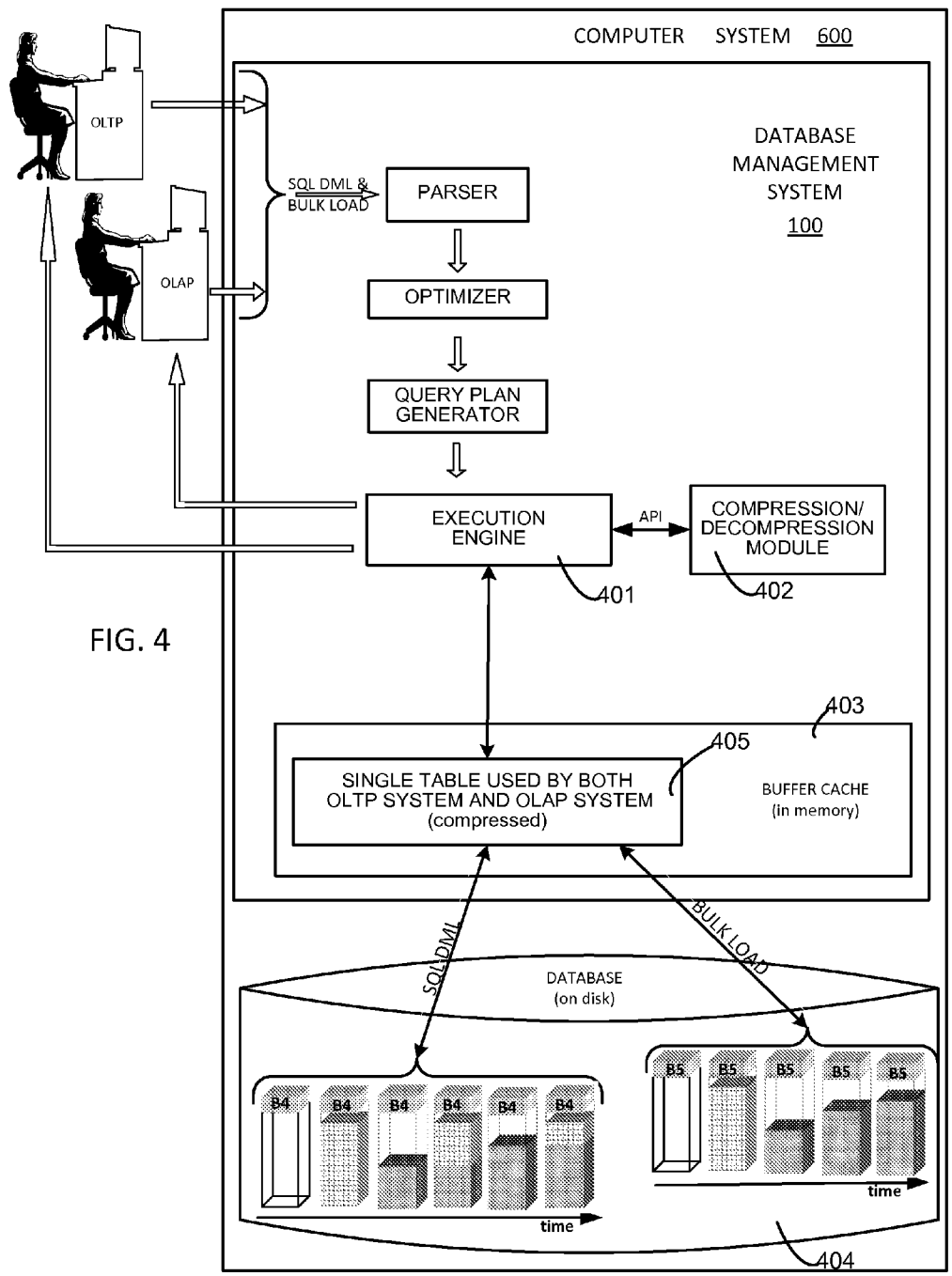
FIG. 4 illustrates, in a high level block diagram, certain components of a database management system in accordance with the invention that supports data compression for a single table that is used by both OLTP systems as well as data warehouse systems, by use of a common compression/decompression module.

In some embodiments, a pre-existing database management system (DBMS) that implements bulk loading for data warehousing systems (FIG. 4) is modified to provide OLTP support in the above-described manner in a programmed computer 600. Hence, a compression and decompression module 402 is used by an execution engine 401 to perform database data compression in a single table 405 against which both types of transactions are executed by DBMS 100, i.e. OLTP transactions as well as OLAP transactions, as illustrated in FIG. 4. Specifically, DBMS 100 of some embodiments uses pre-existing functionality that is already built into compression and decompression module 402 originally used for bulk operations, by modifying them (e.g. by placing wrapper function(s) around one or more preexisting software functions in module 402) to assist in additional acts that implement OLTP data compression.

Specifically, in one illustrative embodiment shown in FIG. 5A, DBMS 100 in a programmed computer system 600 performs pre-existing bulk loading/inserting method 500 consisting of acts 501-508 which are modified to perform a method 510 which includes additional acts 511-513, 516-519, 521, 522, and 523-526 for OLTP data compression. Note that the just-described acts are similar or identical to the corresponding acts described above in reference to FIG. 3A, and many of the reference numerals in FIG. 5A are obtained by adding 210 to the corresponding reference numerals in FIG. 3A, except for act 523. As is seen in FIG. 5A, after the decompression in act 522, control is transferred via an application programming interface (API), to a module 402 (FIG. 4) that performs compression in operation 504 (FIG. 5A). On being called by method 510, module 402 compresses the data in the block to which data was written in act 516 by method 510. After compression is completed in act 504, method 500 returns control back to method 510, specifically to act 523. In act 523, method 510 writes the symbol table into the block, and also writes the compressed data into the block. Then method 510 performs act 524 which is similar or identical to corresponding act 314 described above in reference to FIGS. 3A and 3B.

Figure 5B:
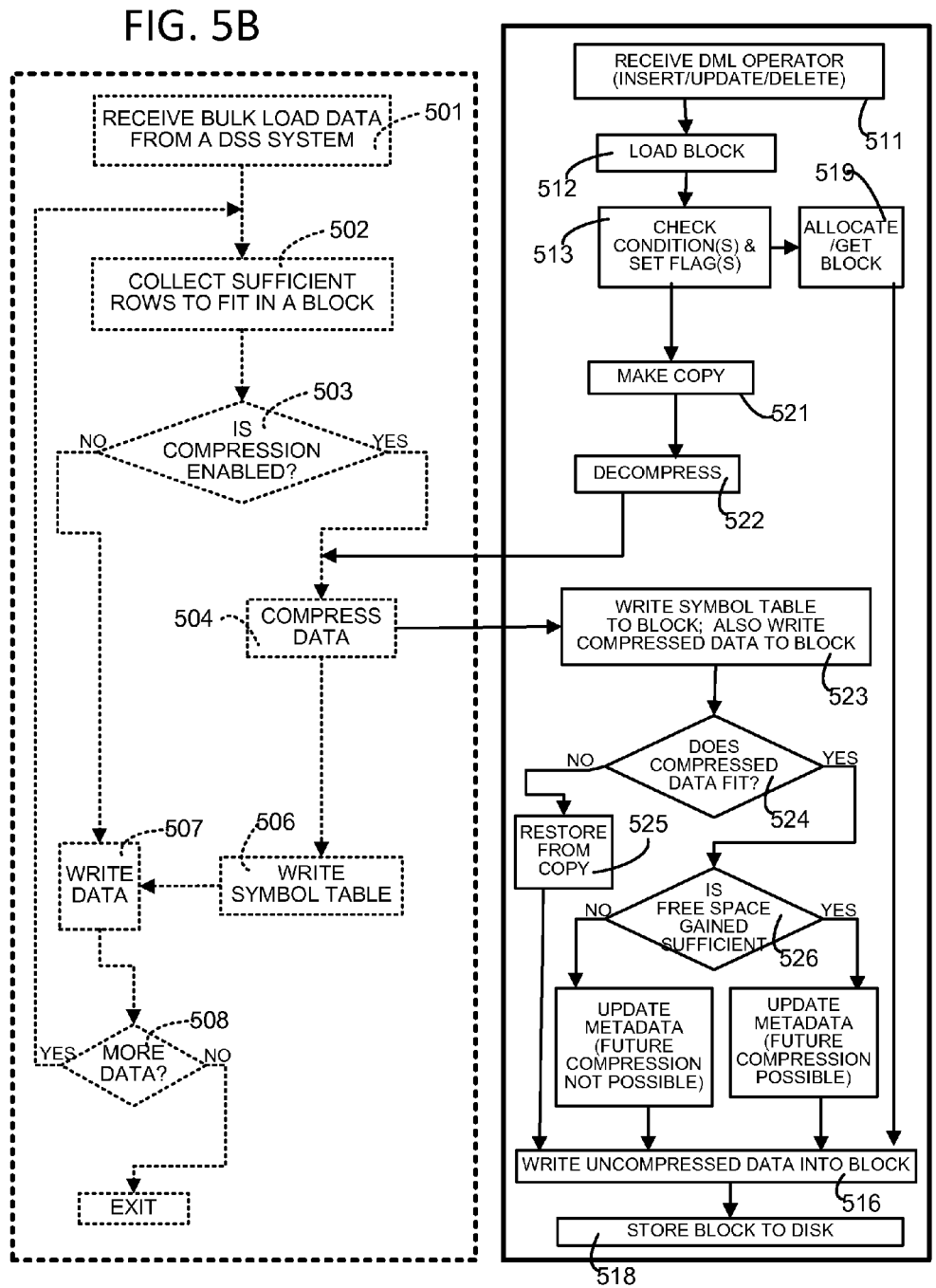

Note that although a specific sequence of acts is illustrated in FIG. 5A for some embodiments, the sequence can be different in other embodiments. For example, certain embodiments perform the methods of FIG. 5B which illustrates implementation of the corresponding methods shown in FIG. 3B.

The compression that is performed by act 504 of some embodiments uses one of two techniques, namely recursive compression and in-line compression. Specifically, in recursive compression, when executing a DML statement within a current transaction, if compression is to be performed, a new transaction is started to do the compression ("compression transaction"). When the compression transaction completes, it commits its work, and returns control back to the current transaction which then proceeds to execute one or more DML operators in the normal manner. Hence, any unused space that is generated by compression transaction becomes available in the current block, regardless of whether or not the current transaction completes successfully or is rolled back. On the other hand, another technique, namely in-line compression is performed within a current transaction itself, and so any unused space that is generated depends on whether and when the current transaction commits. So if the current transaction is rolled back, any unused space generated by in-line compression is not available.

Recursive transaction is performed if the following conditions are satisfied: (A) there is no active transaction in the block to be compressed (or re-compressed), i.e. no transaction (including the current transaction) is modifying the block and (B) the current transaction is able to place a lock on the block as a whole. If either of (A) or (B) cannot be met, then compression is not performed on the block at this stage (i.e. the block will be compressed at some point in future whenever the predetermined condition is met again). An in-line compression can be performed if only the current transaction is active in the current block. So, in-line compression can be used even after the current transaction has started working on the current block, so long as no other transaction is active in the current block.

Figure 6:
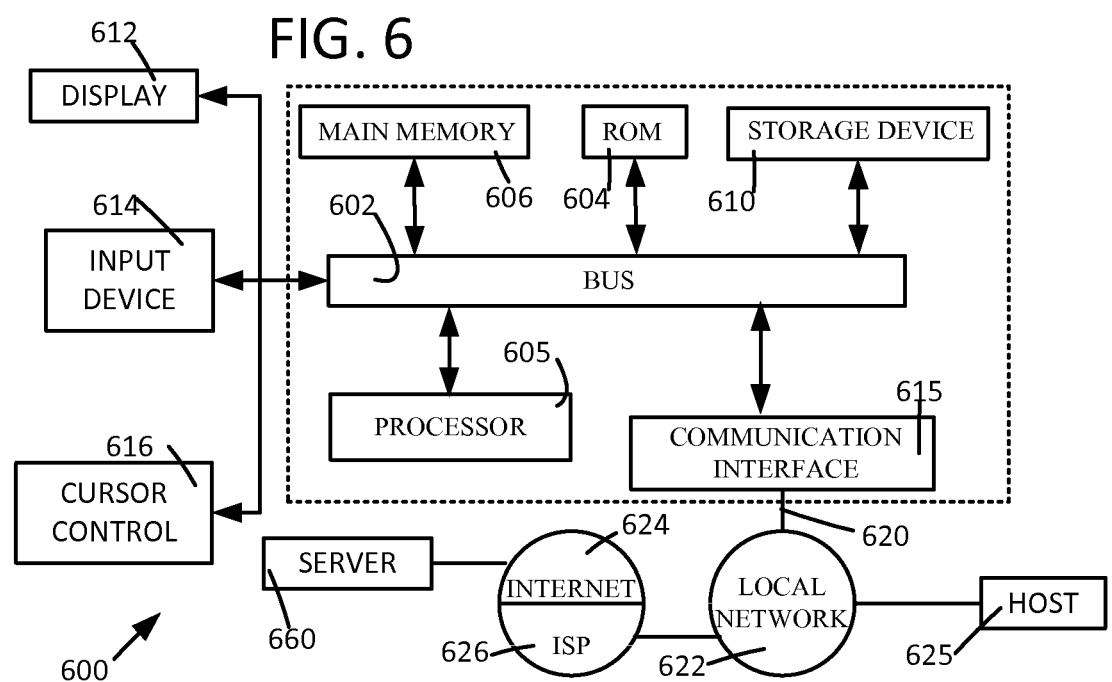
FIG. 6 illustrates, in a high level block diagram, hardware included in a computer that may be used to implement the embodiments of FIGS. 2A-2D in some illustrative implementations of the invention.

Computer system 600 (FIG. 6) may be implemented in some embodiments by use of a computer (e.g. an IBM PC) or workstation (e.g. Sun Ultra 20) that is programmed with a database management system "Oracle 11gR1" available from Oracle Corporation of Redwood Shores, Calif. Such a computer can be implemented by use of hardware that forms a computer system 600 as illustrated in FIG. 6. Specifically, computer system 600 includes a bus 602 (FIG. 6) or other communication mechanism for communicating information, and a processor 604 coupled with bus 602 for processing information.

Computer system 600 also includes a main memory 606, such as a random access memory (RAM) or other dynamic storage device, coupled to bus 602 for storing information and instructions to be executed by processor 604. Main memory 606 also may be used for storing temporary variables or other intermediate information during execution of instructions to be executed by processor 604. Computer system 600 further includes a read only memory (ROM) 608 or other static storage device coupled to bus 602 for storing static information and instructions for processor 604. A storage device 610, such as a magnetic disk or optical disk, is provided and coupled to bus 602 for storing information and instructions.

Computer system 600 may be coupled via bus 602 to a display 612, such as a cathode ray tube (CRT), for displaying information to a computer user. An input device 614, including alphanumeric and other keys, is coupled to bus 602 for communicating information and command selections to processor 604. Another type of user input device is cursor control 616, such as a mouse, a trackball, or cursor direction keys for communicating direction information and command selections to processor 604 and for controlling cursor movement on display 612. This input device typically has two degrees of freedom in two axes, a first axis (e.g., x) and a second axis (e.g., y), that allows the device to specify positions in a plane.

As described elsewhere herein, incrementing of multi-session counters, shared compilation for multiple sessions, and execution of compiled code from shared memory are performed by computer system 600 in response to processor 604 executing instructions programmed to perform the above-described acts and contained in main memory 606. Such instructions may be read into main memory 606 from another computer-readable medium, such as storage device 610. Execution of instructions contained in main memory 606 causes processor 604 to perform the process steps described herein. In alternative embodiments, hard-wired circuitry may be used in place of or in combination with software instructions to implement an embodiment of the type illustrated in FIGS. 2A and 2B. Thus, embodiments of the invention are not limited to any specific combination of hardware circuitry and software.

The term "computer-readable medium" as used herein refers to any non-transitory medium that participates in providing instructions to processor 604 for execution. Such a non-transitory medium may take many forms, including but not limited to non-transitory storage media (which may be non-volatile media or volatile media). Non-volatile media includes, for example, optical or magnetic disks, such as storage device 610. Volatile media includes dynamic memory, such as main memory 606.

Transmission media includes coaxial cables, copper wire and fiber optics, including the wires that comprise bus 602. Transmission media can also take the form of acoustic or light waves, such as those generated during radio-wave and infrared data communications.

Common forms of non-transitory computer-readable storage media include, for example, a floppy disk, a flexible disk, hard disk, magnetic tape, or any other magnetic medium, a CD-ROM, any other non-transitory optical medium, punch cards, paper tape, any other non-transitory physical medium with patterns of holes, a RAM, a PROM, and EPROM, a FLASH-EPROM, any other memory chip or cartridge as described hereinafter, or any other non-transitory storage medium from which a computer can read.

Various forms of non-transitory computer readable media may be involved in carrying the above-described instructions to processor 604 to implement an embodiment of the type illustrated in FIGS. 2A and 2B. For example, such instructions may initially be carried on a magnetic disk of a remote computer. The remote computer can load such instructions into its dynamic memory and send the instructions over a telephone line using a modem. A modem local to computer system 600 can receive such instructions on the telephone line and use an infra-red transmitter to convert the received instructions to an infra-red signal. An infra-red detector can receive the instructions carried in the infra-red signal and appropriate circuitry can place the instructions on bus 602. Bus 602 carries the instructions to main memory 606, in which processor 604 executes the instructions contained therein. The instructions held in main memory 606 may repair optionally be stored on storage device 610 either before or after execution by processor 604.

Computer system 600 also includes a communication interface 618 coupled to bus 602. Communication interface 618 provides a two-way data communication coupling to a network link 620 that is connected to a local network 622. Local network 622 may interconnect multiple computers (as described above). For example, communication interface 618 may be an integrated services digital network (ISDN) card or a modem to provide a data communication connection to a corresponding type of telephone line. As another example, communication interface 618 may be a local area network (LAN) card to provide a data communication connection to a compatible LAN. Wireless links may also be implemented. In any such implementation, communication interface 618 sends and receives electrical, electromagnetic or optical signals that carry digital data streams representing various types of information.

Network link 620 typically provides data communication through one or more networks to other data devices. For example, network link 620 may provide a connection through local network 622 to a host computer 624 or to data equipment operated by an Internet Service Provider (ISP) 626. ISP 626 in turn provides data communication services through the world wide packet data communication network 628 now commonly referred to as the "Internet". Local network 622 and network 628 both use electrical, electromagnetic or optical signals that carry digital data streams. The signals through the various networks and the signals on network link 620 and through communication interface 618, which carry the digital data to and from computer system 600, are exemplary forms of carrier waves transporting the information.

Computer system 600 can send messages and receive data, including program code, through the network(s), network link 620 and communication interface 618. In the Internet example, a server 630 might transmit a code bundle through Internet 628, ISP 626, local network 622 and communication interface 618. In accordance with the invention, one such downloaded set of instructions implements an embodiment of the type illustrated in FIGS. 2A and 2B. The received set of instructions may be executed by processor 604 as received, and/or stored in storage device 610, or other non-volatile storage for later execution. In this manner, computer system 600 may obtain the instructions in the form of a carrier wave.

Numerous modifications and adaptations of the embodiments described herein will be apparent to the skilled artisan in view of the disclosure.

For example, although several embodiments have been described in reference to a block as a unit of storage of a database, other embodiments use other storage structures. Specifically, in some embodiments, methods of the type described herein and illustrated in FIGS. 2A-2D are used with a segment as a unit of storage, wherein the segment includes a number of pages of fixed size. Such embodiments may use, for example, a symbol table for the segment as a whole, whereby references within all pages of the segment point to symbols in the segment-level symbol table. In certain embodiments, each database table is allocated a single segment, and accordingly the symbol table is common to the database table as a whole (unless the database table is partitioned into partitions in which case there is one symbol table for each extent).

Accordingly numerous such modifications and adaptations are encompassed by the attached claims.

What is claimed is:

1. A method implemented in a computer for compression of data in a database, the method comprising:
   determining whether at least one predetermined condition is satisfied;
   in response to the determining that the at least one predetermined condition is satisfied:
   decompressing first compressed data from a block comprising the first compressed data and first uncompressed data, to obtain second uncompressed data from the first compressed data, the block being comprised among multiple blocks in the database; and
   compressing at least the first uncompressed data and the second uncompressed data together, to generate second compressed data; and
   storing the block in a mass storage device.

2. The method of claim 1 wherein:
unused space in the block after compressing is greater than unused space in the block prior to decompressing.

3. The method of claim 1 further comprising:
writing new uncompressed data to the block if at least another predetermined condition is satisfied, else writing the new uncompressed data to another block.

4. The method of claim 3 wherein:
the writing is performed subsequent to the compressing and prior to the storing.

5. The method of claim 3 wherein:
the writing is performed prior to the decompressing; and
the new uncompressed data is compressed during the compressing.

6. The method of claim 1 wherein:
the at least one predetermined condition comprises unused space within the block being below a threshold.

7. The method of claim 1 further comprising:
repeating, at least the decompressing and the compressing, until unused space in the block satisfies another predetermined condition.

8. The method of claim 1 wherein:
the block comprises a set of symbols; and
the second compressed data comprises a plurality of references, each reference identifying a symbol in the set of symbols.

9. The method of claim 8 wherein:
at least a first symbol in the set of symbols is at a level of columns in a database table and at least a second symbol in the set of symbols spans across a group of columns.

10. The method of claim 1 wherein:
the block is comprised in a segment in the database, and the segment comprises the multiple blocks.

11. The method of claim 1 wherein:
the block is of fixed size.

12. The method of claim 1 further comprising:
receiving a database modification language (DML) statement from an on-line transaction processing (OLTP) system, prior to the decompressing.

13. The method of claim 12 wherein:
the database modification language (DML) statement is comprised in a transaction; and
the at least one predetermined condition is satisfied on receipt of a commit statement of the transaction.

14. One or more non-transitory computer readable storage media comprising instructions to at least one processor to process data in a database, the instructions comprising:
instructions to check whether at least one predetermined condition is satisfied;
responsive to the at least one predetermined condition being determined to be satisfied by execution of the instructions to check:
instructions to decompress first compressed data from a block comprising the first compressed data and first uncompressed data, to obtain second uncompressed data from the first compressed data, the block being comprised among multiple blocks in the database; and
instructions to compress at least the first uncompressed data and the second uncompressed data together, to generate second compressed data; and
instructions to store the block in a mass storage device.

15. The one or more non-transitory computer readable storage media of claim 14 wherein:
unused space in the block after compressing is greater than unused space in the block prior to execution of the instructions to decompress.

16. The one or more non-transitory computer readable storage media of claim 14 further comprising:
instructions to write new uncompressed data to the block if at least another predetermined condition is satisfied, else write the new uncompressed data to another block.

17. The one or more non-transitory computer readable storage media of claim 16 wherein:
the instructions to write are to be executed subsequent to execution of the instructions to compress and prior to the instructions to store.

18. The one or more non-transitory computer readable storage media of claim 16 wherein:
the instructions to write are to be executed prior to execution of the instructions to decompress; and
the new uncompressed data is compressed by the instructions to compress.

19. The one or more non-transitory computer readable storage media of claim 14 wherein:
the at least one predetermined condition comprises unused space within the block being below a threshold.

20. The one or more non-transitory computer readable storage media of claim 14 further comprising:
instructions to repeatedly execute, at least the instructions to decompress and the instructions to compress, until unused space in the block satisfies another predetermined condition.

21. The one or more non-transitory computer readable storage media of claim 14 wherein:
the block comprises a set of symbols; and
the second compressed data comprises a plurality of references, each reference identifying a symbol in the set of symbols.

22. The one or more non-transitory computer readable storage media of claim 21 wherein:
at least a first symbol in the set of symbols is at a level of columns in a database table and at least a second symbol in the set of symbols spans across a group of columns.

23. The one or more non-transitory computer readable storage media of claim 14 wherein:
the block is comprised in a segment in the database, and the segment comprises the multiple blocks.

24. The one or more non-transitory computer readable storage media of claim 14 wherein:
the block is of fixed size.

25. The one or more non-transitory computer readable storage media of claim 14 further comprising:
instructions to receive a database modification language (DML) statement from an on-line transaction processing (OLTP) system, prior to execution of the instructions to decompress.

26. The one or more non-transitory computer readable storage media of claim 25 wherein:
the database modification language (DML) statement is comprised in a transaction; and
the at least one predetermined condition is satisfied on receipt of a commit statement of the transaction.

27. A database management system, implemented at least partially by a processor to compress data in a database, the database management system comprising:
means for checking whether at least one predetermined condition is satisfied;
responsive to said at least one predetermined condition being found to be satisfied by the means for checking:
means for decompressing first compressed data from a block comprising the first compressed data and first uncompressed data, to obtain second uncompressed data from the first compressed data, the block being comprised among multiple blocks in the database;

means for compressing at least the first uncompressed data and the second uncompressed data together, to generate second compressed data; and means for storing the block in a mass storage device.

28. The database management system of claim 27 wherein:
the at least one predetermined condition comprises unused space within the block being below a threshold.

29. The database management system of claim 27 further comprising:

means for writing new uncompressed data to the block if at least another predetermined condition is satisfied, else writing the new uncompressed data to another block.

30. The database management system of claim 29 wherein:
the means for writing is to be operated subsequent to operation of the means for decompressing and prior to operation of the means for storing.

31. The database management system of claim 29 wherein:
the means for writing is to be operated prior to operation of the means for decompressing.

32. The database management system of claim 27 further comprising:

means for repeatedly operating, at least the means for decompressing and the means for compressing, until unused space in the block satisfies another predetermined condition.

33. The database management system of claim 27 wherein:
the block comprises a set of symbols; and the second compressed data comprises a plurality of references, each reference identifying a symbol in the set of symbols.

34. The database management system of claim 27 wherein:
at least a first symbol in the set of symbols is at a level of columns in a database table and at least a second symbol in the set of symbols spans across a group of columns.

35. The database management system of claim 27 further comprising:

means for receiving a database modification language (DML) statement from an on-line transaction processing (OLTP) system, prior to operation of the means for decompressing.

\* \* \* \* \*

UNITED STATES PATENT AND TRADEMARK OFFICE
CERTIFICATE OF CORRECTION

| | |
|---|---|
| PATENT NO. | : 8,943,029 B2 |
| APPLICATION NO. | : 13/763663 |
| DATED | : January 27, 2015 |
| INVENTOR(S) | : Marwah |

Page 1 of 1

It is certified that error appears in the above-identified patent and that said Letters Patent is hereby corrected as shown below:

Title Page, item (56)

On page 2, column 2, under Other Publications, line 6, delete "filed Oct." and insert -- filed on Oct. --, therefor.

In the Specification

In column 1, line 61, delete "10gRelease" and insert -- 10g Release --, therefor.

Signed and Sealed this
Twenty-fourth Day of November, 2015

Michelle K. Lee
*Director of the United States Patent and Trademark Office*